United States Patent
Earnshaw et al.

(10) Patent No.: US 8,327,234 B2
(45) Date of Patent: Dec. 4, 2012

(54) CODE BLOCK REORDERING PRIOR TO FORWARD ERROR CORRECTION DECODING BASED ON PREDICTED CODE BLOCK RELIABILITY

(75) Inventors: Andrew Mark Earnshaw, Kanata (CA); Jason Robert Duggan, Kanata (CA); Timothy James Creasy, Kanata (CA)

(73) Assignee: Research In Motion Limited, Waterloo, Ontario (CA)

( * ) Notice: Subject to any disclaimer, the term of this patent is extended or adjusted under 35 U.S.C. 154(b) by 903 days.

(21) Appl. No.: 12/394,228

(22) Filed: Feb. 27, 2009

(65) Prior Publication Data

US 2010/0223534 A1 Sep. 2, 2010

(51) Int. Cl.
*H03M 13/00* (2006.01)
(52) U.S. Cl. .................................................. 714/780
(58) Field of Classification Search .................. 714/748, 714/750–755, 758, 760, 774, 779, 780, 786, 714/790, 799, 801, 821
See application file for complete search history.

(56) References Cited

U.S. PATENT DOCUMENTS

| | | | |
|---|---|---|---|
| 6,438,723 B1 * | 8/2002 | Kalliojarvi | 714/751 |
| 6,950,977 B2 * | 9/2005 | Lavi et al. | 714/794 |
| 7,373,581 B2 * | 5/2008 | Okamura et al. | 714/752 |
| 7,404,132 B2 | 7/2008 | Breitbach | |
| 7,434,149 B2 | 10/2008 | Shih et al. | |
| 2002/0053062 A1 * | 5/2002 | Szymanski | 714/801 |
| 2003/0058820 A1 | 3/2003 | Spencer | |
| 2003/0110437 A1 * | 6/2003 | Kim et al. | 714/752 |
| 2005/0091568 A1 * | 4/2005 | Levy et al. | 714/755 |
| 2009/0106635 A1 * | 4/2009 | Kim et al. | 714/799 |

FOREIGN PATENT DOCUMENTS

| | | |
|---|---|---|
| EP | 1748295 A2 | 1/2007 |
| WO | WO2007/078219 A1 | 7/2007 |

OTHER PUBLICATIONS

"System-Level evaluation of OFDM—further considerations" TSG-RAN WG1#35, R1-031303.zip Lisbon, Portugal Nov. 17-21, 2003.

* cited by examiner

*Primary Examiner* — Nadeem Iqbal
(74) *Attorney, Agent, or Firm* — Gowling Lafleur Henderson LLP

(57) ABSTRACT

Method and a receiver in a communication system for receiving a transport block. The transport block comprises code blocks, each of the code blocks includes an error detection code and an error correction code. Reliability metrics are determined using an input generated during processing of the code blocks after the transport block is received. Each of the reliability metrics corresponds to each of the code blocks. A code block reorderer reorders the code blocks in an order based on the reliability metrics and a selection criterion. A decoder decodes each of the code blocks using the error correction code in the order. A verifier verifies each of the decoded code blocks using the error detection code.

20 Claims, 8 Drawing Sheets

CODE BLOCK REORDERING PRIOR TO FORWARD ERROR CORRECTION DECODING BASED ON PREDICTED CODE BLOCK RELIABILITY

BACKGROUND

The present patent disclosure relates to data transmission, more specifically, the present patent disclosure relates to forward error correction used in data transmission.

The transmission of information data bits may be made through various communication systems. Communication systems are typically designed to maximize performance given system constraints such as power, bandwidth and data rate. Any perturbation between a transmitter and a receiver of a communication system may adversely affect the signal and the information data bits carried in the signal. Hence, the received data bits may be corrupted due to various perturbations during the transmission.

There exist various schemes for providing reliable transportation of data across noisy channels of a communication system. These schemes can be grouped into two categories: error detection schemes and error correction schemes. Error detection is intended to describe the ability to detect the presence of errors caused by noise or other perturbations during transmission from the transmitter to the receiver; error correction is intended to describe the ability to reconstruct the original, error-free data.

Various error detection schemes exist and they are generally quite simple. Examples include: parity scheme, checksum, cyclic redundancy check (CRC), and hash function.

In general, there are two ways to design an error correcting scheme. In a communication system where a feedback is available, automatic repeat request (ARQ) schemes can be implemented. ARQ schemes typically operate with frames of information data, and use acknowledgments and timeouts to achieve reliable data transmission. The frames may include information bits and CRC bits, implemented with a cyclic code. A receiver uses the CRC bits to determine if any bit errors have occurred and, if so, requests a retransmission of the frame by sending a negative acknowledgment (NAK; i.e., an error indication) on the feedback channel. This is repeated until the frame is received without errors, in which case a positive acknowledgment (ACK) is sent. In many cases, the request may be implicit: the receiver sends an ACK of correctly received data, and the transmitter resends anything not acknowledged within a reasonable period of time.

The second error correcting scheme does not send any messages back to the transmitter. With forward error correction (FEC), the transmitter encodes the data with an error-correcting code (ECC) and sends the coded message. The receiver decodes what it receives into the "most likely" data. The codes are designed to increase the immunity of the transmitted signal to noise without increasing signal power, so that it would take an "unreasonable" amount of noise to trick the receiver into misinterpreting the data.

Hybrid ARQ (HARQ) systems combine FEC and ARQ in order to improve ARQ throughput performance. In pure ARQ systems, the probability of a frame being in error is a function of channel bit error rate and frame length. The redundant bits generated by a FEC code are incorporated into the frame-based retransmission approach of ARQ systems. By incorporating FEC, the frame error rate can be reduced significantly. This reduction in frame error rate accordingly reduces the number of retransmissions required and therefore improves throughput performance, but requires more complex transmitter and receiver designs to provide for FEC.

Advanced wireless systems, for example, Third Generation Partnership Project (3GPP) Long Term Evolution (LTE) systems are designed to deliver large amounts of data to the end user. To accomplish this, the amount of user data in a transport block within one radio subframe can be quite large; for example, a downlink radio subframe in 3GPP LTE could contain tens of thousands of bits.

Referring to FIG. 1, where a transport block 102 is large, for example, as in a 3GPP LTE system, the transport block is segmented into multiple code blocks 104, 106, 108, 110, 112, which is advantageous because of benefits such as enabling parallel processing or pipelining implementation and flexible trade off between power consumption and hardware complexity. An error detecting code, for example, CRC 114, 116, 118, 120, 122 is typically applied at the transmitter on a code block by code block basis to provide error protection during over-the-air transmission. For error correction, FEC 124, 126, 128, 130, 132 is then applied to each of the code blocks. The entire transport block may also have a CRC 134 which is calculated across all of the information bits of the entire transport block 102.

The prior art approach to decode the code blocks 104, 106, 108, 110, 112 at the receiver is simply to process them in the order they are received, as indicated by arrow 136 in FIG. 1. If an individual code block, i.e. 110 fails its CRC 118 check, then the transport block CRC 134 can also be assumed to fail and the decoding of any further code blocks within the same transport block can be terminated immediately in order to avoid unnecessary power consumption. However, several code blocks 104, 106, 108, 112 within the transport block 102 may have already been decoded prior to the first code block CRC failure occurring, and this decoding represents wasted effort and power.

In the event of an HARQ retransmission, additional computational expense may be incurred by not maximizing the expected number of successful code blocks processed during the current retransmission round, since those code blocks would not need to be processed (demapped, decoded, etc.) in the following retransmission. Both of these events represent power consumption, and battery drain, at the handset.

There is therefore a need for an improved method and system for decoding code blocks within a transport block.

BRIEF DESCRIPTION OF THE DRAWINGS

These and other features of the invention will become more apparent from the following description in which reference is made to the appended drawings wherein:

FIG. 4 (b) illustrates an exemplary reordering of code blocks based on the reliability metric;

FIG. 4 (c) illustrates another exemplary rearrangement of code blocks based on the reliability metric;

FIG. 5 (b) is another exemplary diagram showing functional blocks in a receiver in which the embodiments of the present patent disclosure can be practiced;

FIG. 5 (c) shows exemplary inputs for generation of reliability metrics;

DETAILED DESCRIPTION OF PREFERRED EMBODIMENTS

Figure 1:
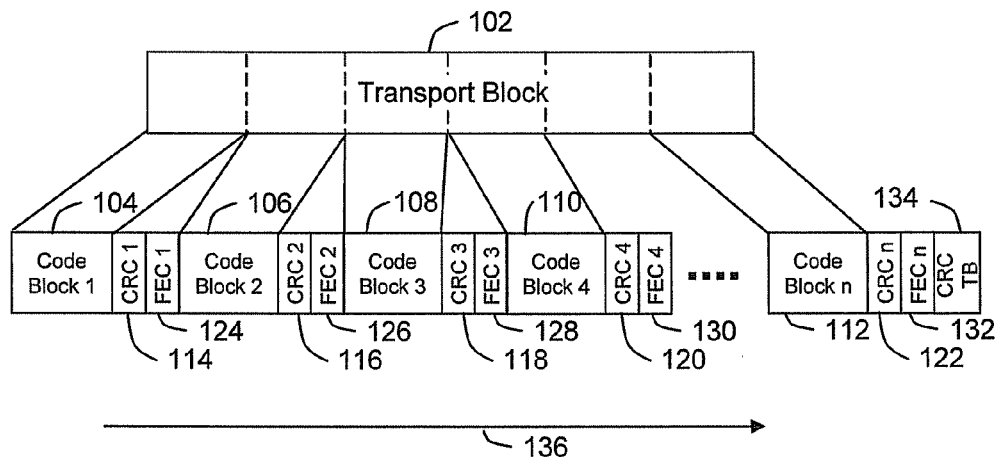
FIG. 1 shows a diagram of a transport block comprising a plurality of code blocks.

Reference will now be made in detail to some specific embodiments. Examples of these specific embodiments are illustrated in the accompanying drawings. While the patent disclosure is described in conjunction with these specific embodiments, it will be understood that it is not intended to limit the patent disclosure to the described embodiments. On the contrary, it is intended to cover alternatives, modifications, and equivalents as may be included within the spirit and scope of the patent disclosure as defined by the appended claims. In the following description, numerous specific details are set forth in order to provide a thorough understanding of the present patent disclosure. The present patent disclosure may be practiced without some or all of these specific details. In other instances, well-known process operations have not been described in detail in order not to unnecessarily obscure the present patent disclosure.

According to an aspect of the patent disclosure there is provided a receiver in a communication system. The receiver comprises a receiving module receiving a transport block, the transport block comprised a plurality of code blocks, each of the plurality of code blocks including an error detection code and an error correction code; a first circuit determining a plurality of reliability metrics using an input generated during processing of the code blocks, each of the plurality of reliability metrics corresponding to each of the plurality of code blocks; a code block reorderer reordering the plurality of code blocks in an order based on the plurality of reliability metrics and a selection criterion; a decoder decoding each of the plurality of code blocks using the error correction code in the order; and a verifier verifying each of the plurality of code blocks using the error detection code.

According to another aspect of the patent disclosure there is provided a method of receiving a transport block of data, the method comprises: receiving a transport block, the transport block comprising a plurality of code blocks, each of the plurality of code blocks including an error detection code and an error correction code; determining a plurality of reliability metrics using an input generated during processing of the code blocks, each of the plurality of reliability metrics corresponding to each of the plurality of code blocks; reordering the plurality of code blocks in an order based on the plurality of reliability metrics and a selection criterion; decoding each of the plurality of code blocks using the error correction code in the order; and verifying each of the plurality of code blocks using the error detection code.

According to another aspect of the patent disclosure there is provided a computer storage medium readable by a computer encoding a computer program for execution by the computer to carry out the above described method.

The terminology used herein is for the purpose of describing particular embodiments only and is not intended to be limiting of the patent disclosure. As used herein, the singular forms "a", "an" and "the" are intended to include the plural forms as well, unless the context clearly indicates otherwise.

It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

The corresponding structures, materials, acts, and equivalents of all means or steps plus function elements in the claims below are intended to include any structure, material, or act for performing the function in combination with other claimed elements as specifically claimed. The description of the present patent disclosure has been presented for purposes of illustration and description, but is not intended to be exhaustive or limited to the patent disclosure in the form disclosed. Many modifications and variations will be apparent to those of ordinary skill in the art without departing from the scope and spirit of the patent disclosure. The embodiment was chosen and described in order to best explain the principles of the patent disclosure and the practical application, and to enable others of ordinary skill in the art to understand the patent disclosure for various embodiments with various modifications as are suited to the particular use contemplated.

Those skilled in the art will appreciate that the patent disclosure may be practiced with many computer system configurations, including personal computers, hand-held devices, multi-processor systems, microprocessor-based or programmable consumer electronics, network PCs, minicomputers, mainframe computers and the like. The patent disclosure may also be practiced in distributed computing environments where tasks are performed by remote processing devices that are linked through a communications network. In a distributed computing environment, program modules may be located in both local and remote memory storage devices.

As used herein, the term "transmission" is intended to describe the process of sending, propagating and receiving an information signal over a physical point-to-point or point-to-multipoint transmission medium, either wired or wireless. Transmission typically involves the use of a digitized signal.

The term "wireless transmission" is intended to describe transmission in which electromagnetic waves carry a signal over part or the entire communication path. Wireless transmission may include, but is not limited to, Code Division Multiple Access (CDMA), Time Division Multiple Access (TDMA), Frequency Division Multiple Access (FDMA), Orthogonal FDMA (OFDMA), Single-Carrier FDMA (SC-FDMA). wireless local area networks (WLANs), broadcast networks. CDMA may include, but is not limited to, cdma2000, Universal Terrestrial Radio Access (UTRA). TDMA may include, but not limited to, technology such as Global System for Mobile Communications (GSM). An OFDMA system utilizes Orthogonal Frequency Division Multiplexing (OFDM) and sends modulation symbols in the frequency domain on orthogonal subcarriers, and may be implemented in technologies such as E-UTRA or E-UTRAN.

The term "radio subframe" or "wireless subframe" is intended to describe the basic time interval used for data transmission on the radio physical channel in wireless transmission. In 3GPP LTE, for example, a radio subframe is a numbered time interval of 1 ms duration.

The term "transport block" is intended to describe a unit of data that is mapped to a radio subframe. The size of the transport block may be determined by the governing radio interface protocol, it is therefore possible for a radio subframe to include one or more transport blocks. The transport block may have a fixed or variable size.

The term "code block" is intended to describe a sub-unit of a transport block. A code block is generally encoded individually using an error detection and/or error correcting encoding scheme. The encoding generates both error detection and error correction capability for the information to be transmitted. The number of code blocks within a transport block may vary, depending on the underlying protocol. For example, an LTE downlink transport block to be decoded at the handset would contain a maximum of 9 code blocks for a Category 2 User Equipment (UE) and a maximum of 50 code blocks for a Category 5 UE.

The term "downlink communication" is intended to describe transmission from a base station to a mobile station in a wireless communication system, and the term "uplink communication" is intended to describe transmission from a mobile station to a base station. The wireless communication system may generally include multiple base stations and multiple mobile stations, while a single base station often communicates with a set of mobile stations. Base stations and mobile stations may employ multiple antennas for transmitting and receiving radio wave signals. A mobile station may include, but not limited to, a PDA, laptop, or handheld device.

The term "forward error correction (FEC)" is intended to describe a method for error control in data transmission whereby the sender adds redundancy to the original information data bits using a predetermined algorithm, allowing the receiver to detect and correct errors. The original information data bits may or may not appear in the encoded output; codes that include the original information data bits in the output are systematic, while those that do not are non-systematic.

FEC can be categorized into block coding and convolutional coding. Using block coding, the encoder intersperses parity bits into the data sequence using a particular algebraic algorithm, and the decoder applies an inverse of the algebraic algorithm to identify and correct any errors caused by channel corruption. Block coding uses fixed-size blocks of bits of predetermined size. Examples of block code include Reed-Solomon coding, Golay, Bose-Chaudhuri-Hochquenghem (BCH) and Hamming coding.

Convolutional coding processes the incoming bits in streams rather than in blocks. The convolutional encoding of a bit is strongly influenced by the bits that preceded it. A convolutional decoder takes into account past bits when trying to estimate the most likely sequence of data that produced the received sequence of code bits.

One example of a convolutional decoder is the Viterbi algorithm. At each bit-interval, the Viterbi decoding algorithm compares the actual received coded bits with the coded bits that might have been generated for each possible memory-state transition. It chooses, based on metrics of similarity, the most likely sequence within a specific time frame.

Another example code that uses convolutional encoders is turbo coding, a scheme that combines two or more relatively simple convolutional codes and an interleaver to produce a block code that can approach the theoretical limit of channel capacity, as characterized by the so-called Shannon Limit. Turbo coding is used in CDMA2000 1x (TIA IS-2000), 1xEV-DO (TIA IS-856), as well as 3GPP LTE.

The term "automatic repeat request (ARQ)" is intended to describe an error correction scheme when a feedback channel is available. ARQ schemes typically operate with frames of information data. The frames include information bits and error-detecting bits, for example, CRC bits implemented with a cyclic code. A receiver uses the CRC bits to determine if any bit errors have occurred and, if so, requests a retransmission of the frame by sending a negative acknowledgment (NAK; i.e., an error indication) on the feedback channel. This is repeated until the frame is received without errors, in which case a positive acknowledgment (ACK) may be sent. The bit error rate (BER) of ARQ schemes is determined by the undetected error rate of the error detecting code and is usually selected to be very low.

The term "hybrid ARQ (HARQ)" is intended to describe a combination of FEC and ARQ in order to improve ARQ performance in communication systems with unreliable and time-varying channel conditions. Early versions of HARQ, Type-I HARQ, add both error detection, for example, CRC, and FEC information to each message prior to transmission. The receiver then uses the decoding algorithm corresponding to the FEC scheme to decode the error-correction code. The CRC is then computed to determine if the received data contains errors, if the channel quality is insufficient, and not all transmission errors can be corrected, the receiver will detect this situation using the error-detection code, and retransmission may be requested. Any retransmitted bits may be combined with the previously-received bits in order to improve the probability of a successful decoding. Conversely, if the channel quality is good enough, all transmission errors should be correctable, and the receiver can obtain the correct data block. The throughput of the Type-I HARQ is limited to a maximum value equal to the rate of the FEC code used.

In a more sophisticated form, Type-II HARQ adaptively varies the amount of additional error correcting bits sent to the receiver. Type-II HARQ initially transmits only information bits and CRC bits (although some error correcting bits may also be included). Subsequent retransmission requests entail incremental transmission of error correcting bits and/or the original systematic information bits. As for Type-I HARQ, each error correcting increment may optionally be combined with the previously received symbols by a decoder in the receiver. After each retransmission, the receiver is decoding a more powerful, lower rate code. Type-II HARQ systems have the ability to vary their throughput dynamically as channel conditions change.

Figure 2:
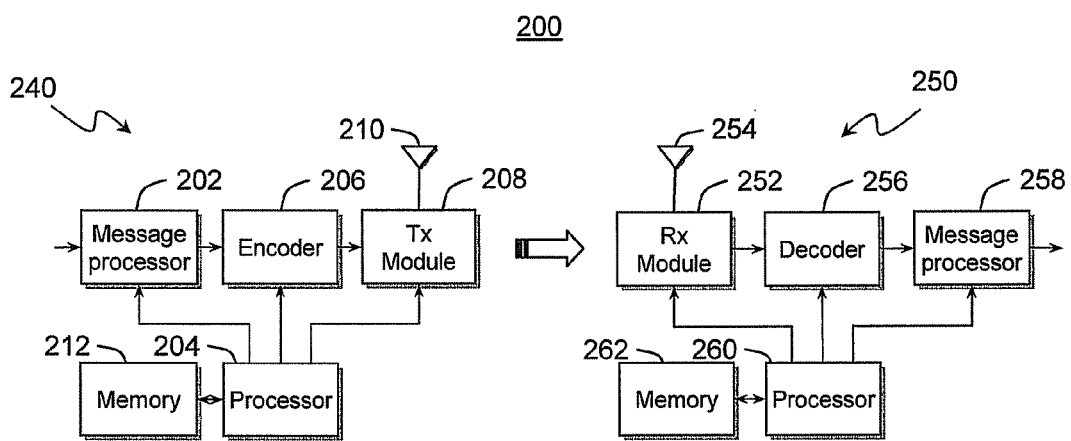
FIG. 2 is a block diagram of a transmitter and a receiver in a communication system.

Referring to FIG. 2, a block diagram of a transmitter 240 and a receiver 250 in a communication system 200, for example, a wireless communication system, is shown. For a downlink communication in a wireless system, transmitter 240 may be part of a base station, and receiver 250 may be part of a terminal.

At transmitter 240, a message processor 202 receives information from a data source (not shown) and/or a processor 204 and generates a transport block for the received information. The transport block may have a fixed or variable size. An encoder 206 receives the transport block from processor 202, divides the transport block into code blocks and encodes the code blocks based on an error detection and/or error correcting encoding scheme. The encoding generates both error detection and error correction capability for the information to be transmitted.

A transmitting module 208 processes the encoded code block from encoder 206 and generates a modulated signal. The modulated signal is transmitted via an antenna 210.

At receiver 250, an antenna 254 receives the transmitted signal from transmitter 240 and provides a received signal to a receiving module 252. Receiving module 252 processes the received signal in a manner complementary to the processing performed by transmitting module 208 and provides received code blocks. A decoder 256 decodes each received code block and provides a corresponding decoded message to a message processor 258. Decoder 256 performs decoding in a manner complementary to the encoding performed by encoder 206 at transmitter 240. For example, decoder 256 may perform block decoding for a block code, Viterbi decoding for a convolutional code, Turbo decoding for a Turbo code, etc. Message processor 258 recovers information from each decoded message, performs an error detecting algorithm and provides the information to a data sink (not shown) and/or a processor 260.

Processors 204 and 260 control the operation at transmitter 240 and receiver 250, respectively. Memories 212 and 262 store data and program codes for transmitter 240 and receiver 250, respectively.

Figure 3:
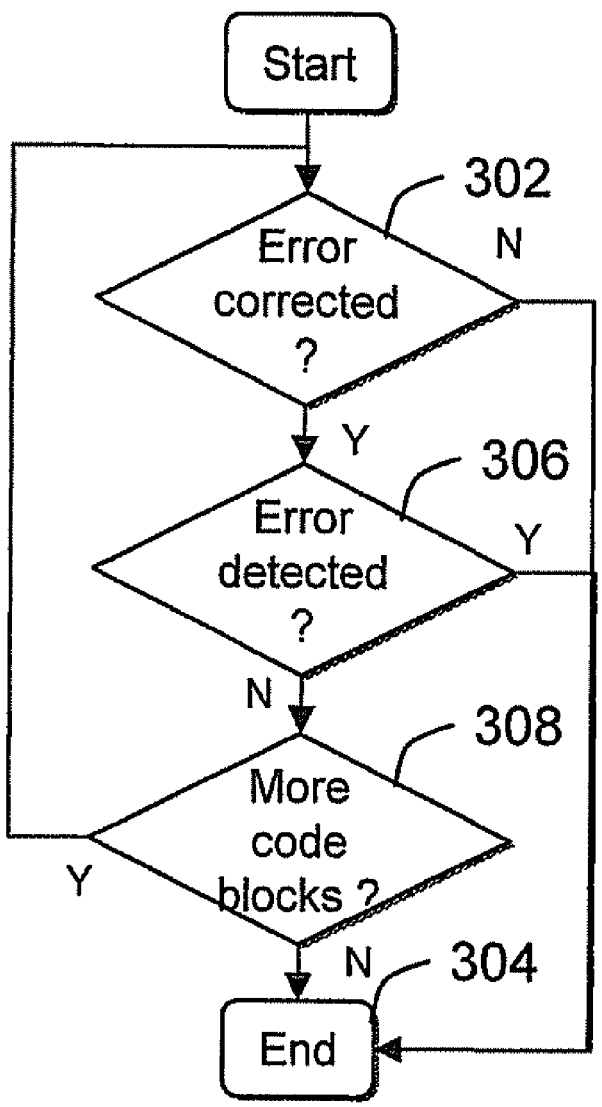
FIG. 3 depicts the steps of a decoding process.

Referring to FIGS. 1 to 3, when a transport block 102 is received, the individual code blocks 104, 106, 108, 110, and 112 are first decoded by the decoder 256, the code blocks generally are decoded in the order in which they are received at the receiving receiver 250, as indicated by the arrow 136 in FIG. 1. The use of error correction significantly increases the probability of being able to successfully decode the original information at the receiver 302, however, if the error cannot be corrected for any code block 104, 106, 108, 110, 112 and the respective error detection bits 114, 116, 118, 120 and 122, the decoding process will end 304. If the code blocks 104, 106, 108, 110, 112 including error detection bits 114, 116, 118, 120 and 122 are correctly decoded, i.e. any detected error corrected, the received code blocks 104, 106, 108, 110, 112 are successively verified using error detection code, for example, CRC, to ensure that the data has been correctly received 306. Error detection codes such as CRC generally are a function of the original information bit values, for example, code blocks 104, 106, 108, 110, 112. Error detection codes are usually computed at the transmitter 240 and included within the code block data prior to encoding. At the receiver 250, the decoded bits are used to recalculate the CRC. If the receiver CRC matches the value that was sent by the transmitter, then the data is assumed to have been received correctly. In addition to each code block 104, 106, 108, 110, 112 having its own individual CRC 114, 116, 118, 120, 122, the entire transport block 102 also has a CRC 134 which is calculated across all of the information bits of the entire transport block. This second-level transport block CRC provides an additional layer of integrity protection and verification.

Continuing with using CRC as an example, if an individual code block 110 fails its CRC 120 check 306, then the transport block CRC 134 can also be assumed to fail and the decoding of any further code blocks within the same transport block can be terminated 304 immediately. However, several code blocks 104, 106, 108 within the transport block 102 have already been decoded prior to the first code block CRC 110 failure occurring, and this decoding may represent wasted effort.

For handset manufacturers, one of the prime design considerations is to maximize battery life by minimizing power consumption wherever possible. The error correction decoder typically represents a significant amount of power consumption at the receiver due to the number of computations that must be performed. It is therefore desirable to minimize the number of decoding attempts that are made on code blocks within a given transport block. For example, if a code block decoding fails on the first transmission attempt, a retransmission would be requested. A second decoding attempt would then need to be made on the retransmitted received data, and this would represent additional power consumption.

Advanced wireless systems such as 3GPP LTE are designed to deliver large amounts of data to the end user. The transport block can be quite large, and in some systems such as in LTE, the entire transport block needs to be retransmitted, as retransmissions of the failed code blocks only cannot be requested. For example, a typical HARQ operating point in a real-life system would commonly have an expected raw error rate of 10-15%. That is, 10-15% of the transport blocks would fail to be decoded properly in their first transmission attempt. Consequently, the number of transport block and/or code block CRC failures would be expected to be significant, resulting in considerable wasted effort and power.

Figure 4:
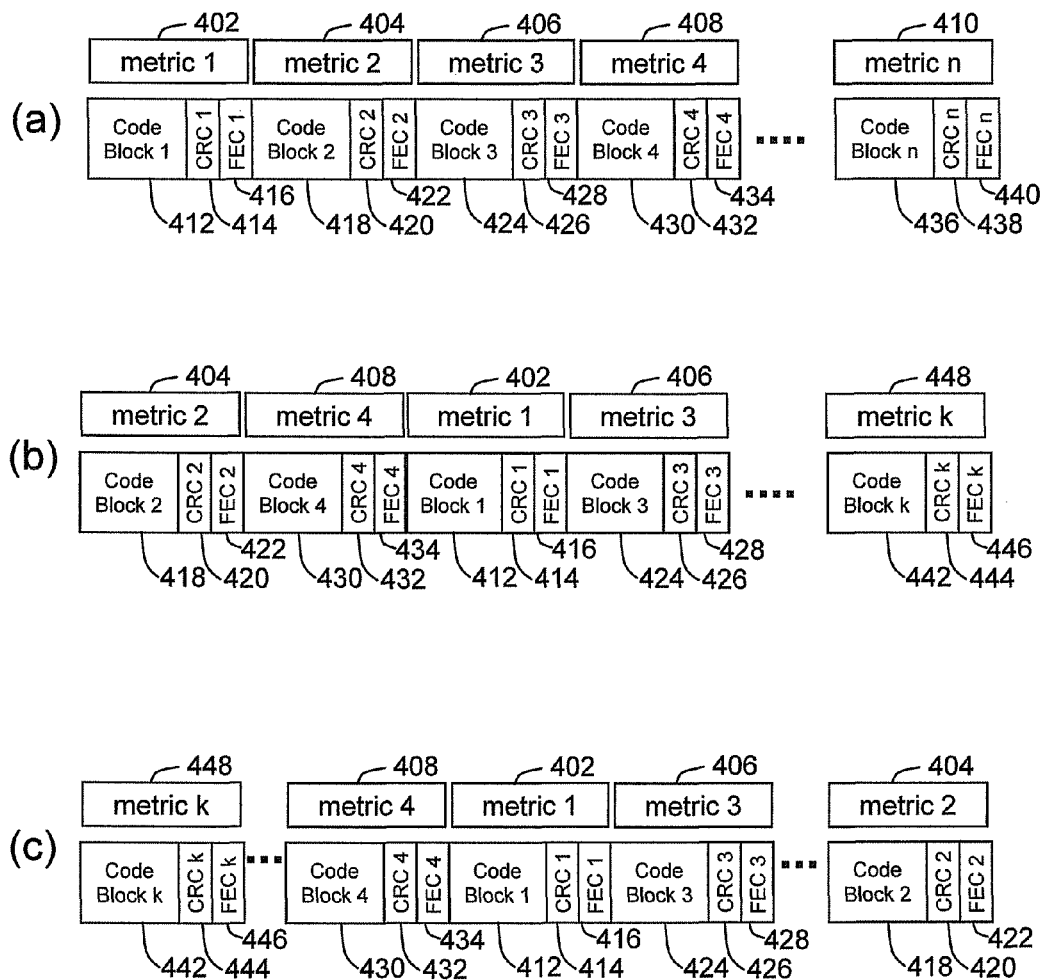
FIG. 4 (a) illustrates metrics predicting the reliability of the code blocks.

Referring to FIG. 4($a$), in accordance with one embodiment of the present patent disclosure, a reliability metric 402, 404, 406, 408, 410 predicting the reliability of the code block is provided for each of the code blocks 412, 418, 424, 430 and 436. The reliability metrics may be considered as an indication of the probability that the received data prior to decoding will be successfully decoded. Based on the metrics, as indicated in FIGS. 4($b$) and ($c$), the code blocks 412, 418, 424, 430 and 442 are re-arranged before the decoding.

Figure 5:
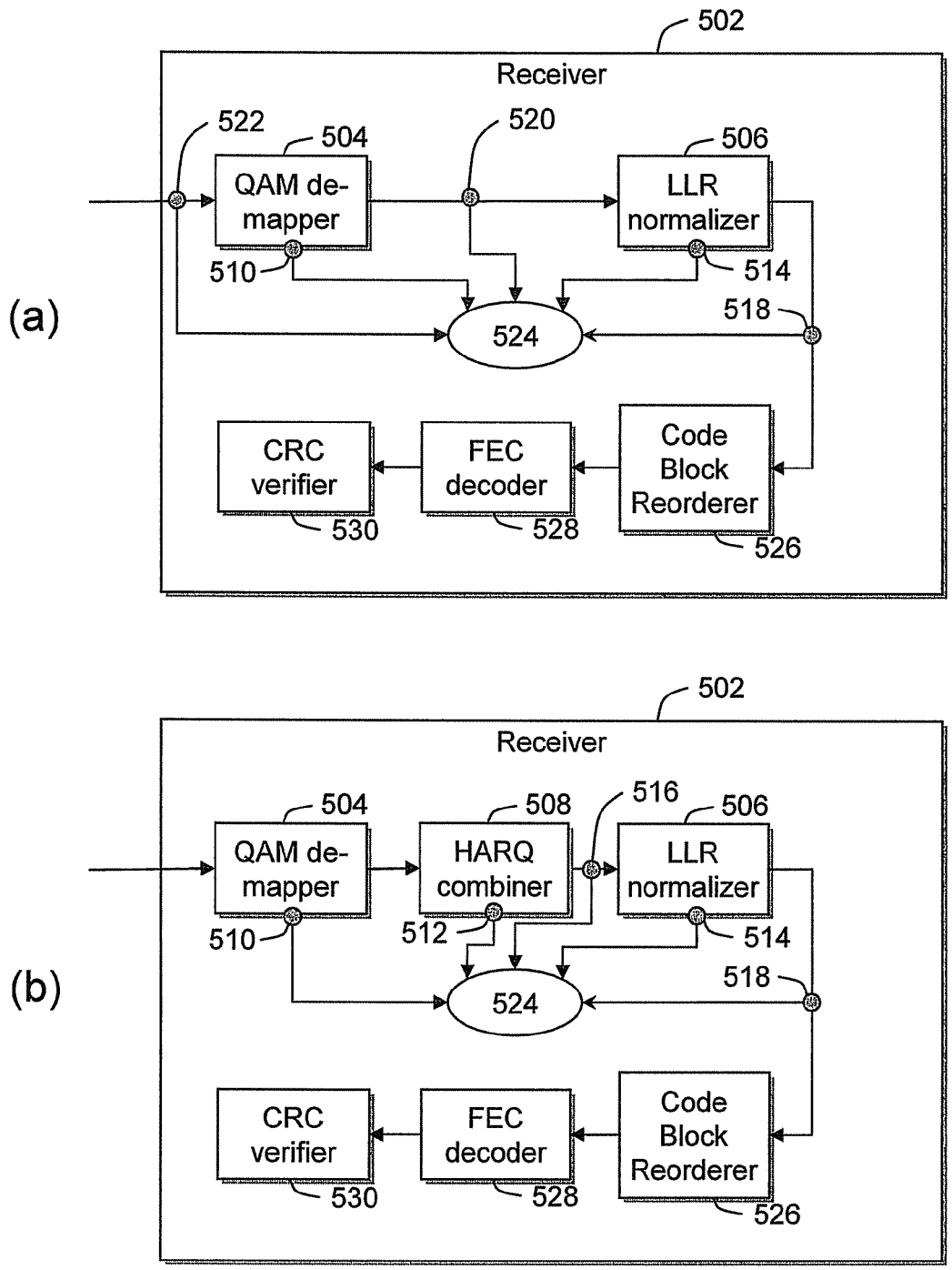
FIG. 5 (a) is an exemplary diagram showing functional blocks in a receiver in which the embodiments of the present patent disclosure can be practiced.
Figure 5:
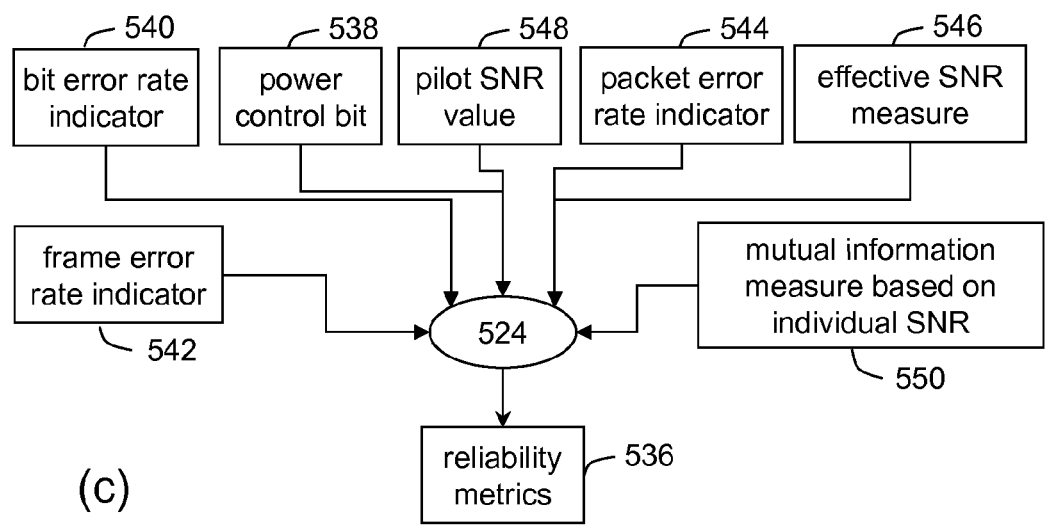

FIG. 5($a$) is a diagram showing the functional blocks in a receiver 502 implementing one embodiment of the present patent disclosure. It should be apparent to a person skilled in the art that the functional blocks may be implemented in one or more of the receiving module 252, decoder 256, message processor 258, and/or processor 260 in the receiver 250 as described in FIG. 2.

Quadrature amplitude modulation (QAM) is often used in next generation wireless communication systems to increase spectral efficiency by increasing the number of coded bits carried per modulation symbol. In FIG. 5($a$), the received signal is first processed at a demapping element, or demapper, for example, a QAM demapper 504. In the QAM demapper 504, the received signal is demodulated into I real and Q imaginary data (which was originally mapped using a constellation having M bits for each I and Q data), demapped, and deinterleaved. The QAM demapper 504 estimates an amplitude of a signal constellation of a QAM signal. The signal may include a pilot channel and a supplemental channel. The QAM demapper 504 may estimate the amplitude based upon a power of a signal combination of a traffic symbol and a pilot symbol. A signal and noise estimator inside the QAM demapper 504 may estimate signal and noise characteristics and/or the wireless channel response based on the demapped symbols. The QAM demapper 504 may also include MIMO decoding in the event of a multi-antenna system. The modulation demapper is described here using a QAM demapper 504, however, it should be apparent to a person skilled in the art that other demappers may be used implementing other modulation schemes, for example but not limited to, PSK, ASK, GMSK, FSK.

Different approaches may be used to estimate SNR (Signal to Noise Ratio) values at the receiver. One exemplary approach may involve using the known reference symbols, for example, pilots that were included within the transmitted signal. The average power of these reference symbols may be used to obtain an estimate of the signal power, and the average variance of the reference symbols from their known expected values may be used to provide an estimate of the noise power. It should be recognized that many other methods may also be used to obtain SNR estimates at the receiver.

A log-likelihood-ratio (LLR) normalizer 506 computes and normalizes LLRs for code bits based on the received symbols and the signal, noise and/or channel estimates. In the LLR normalizer 506, both the mean received data symbol energy, and the noise variance of the demapped symbols are used to compute the LLR. The LLR values are further scaled to ensure they lie within the valid range of input values expected by the FEC decoder.

A reliability metric for predicting the relative probability of successfully decoding a code block may also be computed from the LLR values. For example, if the LLRs for a given code block exhibited a low variance, i.e. all of the LLRs were of approximately the same reliability, then the corresponding code block may be considered to be more reliable than a code block whose LLR values exhibited a high variance. Another exemplary approach may involve calculating the ratio of the number of more reliable LLR values, for example, but not limited to LLR values whose magnitudes lie above a certain threshold, to the number of less reliable LLR values, for example, but not limited to LLR values whose magnitudes fall below a certain threshold within a code block in order to predict the relative reliability of successfully decoding a code block. It should be noted that these are only examples of possible methods that could be used to estimate a reliability metric, and the present patent disclosure is by no means limited to use only these possible approaches.

If the data integrity cannot be verified at the receiver when one or more of the CRC checks fail, it may be possible to request a retransmission from the transmitter through ARQ, or HARQ. For HARQ, both Type I and Type II, this second set of received data may then be combined with the previously received data in order to improve the probability of successfully decoding the FEC-protected data. Depending upon the system design and configuration, multiple retransmission rounds may also be possible.

Referring to FIG. 5(b), a HARQ combiner 508 is provided to combine incremental transmissions of error correcting bits from subsequent retransmissions with the previously received symbols in the receiver 502.

There are numerous locations in the receiver 502, where the information for the reliability metrics 402, 404, 406, 408, 410 may be provided. The reliability metric may be derived from the Signal-to-Noise-Ratio (SNR) of the QAM demapped values 520, from the LLR statistics (e.g. mean and/or variance) 518. The selected input data for the reliability metric calculation is collected by a first circuit 524, for example, a processor to calculate the reliability metric. It should be apparent to a person skilled in the art that it is possible to combine the reliability metric computation with an existing receiver processing component as described in the above to minimize the incremental power cost. This is illustrated in FIG. 5(a), for example, where the code block reliability metrics may be generated at the first circuit 524 using the raw output data 520 from the QAM demapper 504 or processed values 510 provided directly by the QAM demapper 504. Similarly, the reliability metrics may also be generated at the first circuit 524 using the raw LLR values 518 or processed values 514 provided by the LLR normalizer 506. A further similar relationship exists in FIG. 5(b) between the raw output data 516 and summary values 512 provided by the HARQ combiner 508.

It should be apparent to a person skilled in the art that depending on the receiver design, the order of the HARQ combining and LLR normalization operations may be reversed. Further, the reliability metric calculation could conceivably be combined with one of the existing operations where the numeric values are already being processed, to minimize the incremental cost of computing the reliability metric. In the event of using some function of the Exponential Effective SNR Mapping (EESM), as set forth below, possibly based on the pilots or the channel estimation results, the predicted reliability metric may even be computed prior to the QAM demapping operation. This may facilitate the reordering of the code block processing in an advantageous fashion if a pipelined implementation design is used by providing a more complete list of code blocks for reordering.

In FIGS. 5(a) and (b), QAM is used as an exemplary modulation scheme. It should be apparent to a person skilled in the art that other schemes, such as amplitude-shift keying (ASK), phase-shift keying (PSK), and frequency-shift keying (FSK) may also be used. If such a different modulation scheme is used, the associated modulation demapper would also vary from the QAM demapper referred to here. Similarly, multiplexing schemes such as coding division multiplexing (CDM), frequency division multiplexing (FDM), orthogonal frequency division multiplexing (OFDM) may also be used.

Referring to FIG. 5(c), reliability metrics 536 may be derived from, but not limited to, other parameters such as power control bit 538 of any suitable CDMA protocol, bit error rate indicator 540, frame error rate indicator 542, packet error rate indicator 544, other suitable quality indicator, or any combination of the preceding.

For example, a reliability metric may be derived from an effective SNR measure 546 based on the OFDM subcarrier or pilot SNR 548 values in OFDM-based systems, such as the EESM. EESM is described in Ericsson's, "System-level evaluation of OFDM -further considerations," 3GPP TSG-RAN WG1 #35, R1-031303, Nov. 17-21, 2003, available at http://www.3gpp.org/ftp/tsg_ran/WG1_RL1/TSGR1_35/Docs/Zips/R1-031303.zip, the entirety of which is incorporated herein by reference.

The EESM technique was originally derived to assist with modeling link-layer performance in a system-level OFDM simulator. In an OFDM system, the SNR of each OFDM subcarrier is different, depending upon the current transmission channel and multi-path conditions. The EESM technique allows all of the SNR values for the subcarriers of a given code block to be combined and mapped into a single scalar value; that is, a single effective SNR value that may then be used to obtain an expected BLER (Block Error Rate) from a BLER curve for an AWGN (Additive White Gaussian Noise) transmission channel. An EESM value may also be used directly as a relative decoding-reliability metric since larger EESM values would correspond to lower expected block error rates, and thus a higher probability of successfully decoding a given code block. Consequently, for an OFEDM system or other such wireless system where the received SNRs of different modulation symbols within a given code block may vary, an EESM measure may be used as a possible code block reliability metric.

Another measure that is applicable to a mixed modulation scenario is one based on a mutual information measure 550. Here there are separate modulation and coding models. The modulation model maps the SINR of each of the individual subcarriers to a symbol-by-symbol mutual information based on the modulation order. The coding model then maps the sum or average of the mutual information values across the code block to a decoding reliability measure.

As each of the individual code blocks including the error detecting code, for example, CRC, is processed independently at the receiver, the reliability metric is used by the code block reorderer 526 to reorder the individual code blocks of the transport block 102, before the decoding by an error correction decoder, for example, a FEC decoder 528. The reordering or sorting of the code blocks is based on predetermined criteria or sorting preference, to provide the desired advantages, for example but not limited to, power savings. The predetermined criteria or sorting preference may include, but not limited to: whether retransmissions are enabled, the present point in the retransmission cycle, etc.

In case that no further retransmissions are possible, for example, ARQ/HARQ is disabled, or the maximum allowed number of transmission attempts has already been reached, it may be desirable to detect a code block error, for example a CRC failure, and subsequent transport block CRC failure, using the minimum expected number of code block decoding attempts. It would therefore be desirable to order the code blocks from least reliable to most reliable based on the reliability metrics, so that decoding attempts are made on the least reliable code blocks first. If any of the code block CRC tests fail, then the transport block CRC will also fail. The least reliable code blocks are most likely to fail their CRC verifications, thus enabling further processing, for example, FEC decoding, of the remaining code blocks of the transport block to be terminated as quickly as possible to reduce overall power consumption. Referring to FIG. 4(b), the reliability metric 2 404 indicates a lower reliability than reliability metric 4 408 which in turn has a lower reliability than reliability metric 1 402, and so on. The highest reliability is indicated by reliability metric k 448. The selection criterion is therefore the lowest reliability metric first.

In other situations where retransmissions are possible, a certain amount of receiver processing has already been performed on each of the code blocks prior to the FEC decoding, for example, QAM demapping, LLR generation. For any code blocks that are successfully decoded in the current transmission, the receiver processing would not need to be repeated in the event of a retransmission and this would result in power savings. Typically, the entire transport block is retransmitted in the event of code block decoding failure resulting in a transport block decoding failure. However, the more code blocks of the transport block that have already been successfully decoded at the receiver, the less the remaining code blocks of the transport block will need to be processed after the retransmission of that transport block, including receiver processing prior to FEC decoding, which would represent duplicate effort and thus wasted power. In this situation, as illustrated in FIG. 4(c) the code blocks are sorted from most reliable 442 to least reliable 418 to maximize the expected number of code blocks that would be decoded successfully before a code block CRC failure is encountered. The selection criterion is therefore the highest reliability metric first. This would in turn reduce the number of code block units that would need to be processed at the receiver following the next retransmission attempt, and reduce the overall power consumption. Further, if any of the individual code block CRC checks at the receiver fails, then the corresponding transport block CRC verification can also be assumed to fail, without necessarily having to actually calculate the transport block CRC at the receiver.

It should be apparent to a person skilled in the art that the above two scenarios are examples only, and that other possible code block orderings using other selection criteria may be possible depending upon the circumstantial conditions of a specific scenario.

Further, the comparisons of predicted code block reliabilities may be performed through relative comparison, requiring no calibration of the overall process to determine any absolute decision threshold values. However, depending upon the specific reliability metric being used and the manner in which it is calculated, some derivation of suitable parameter values may be provided.

In a practical receiver implementation, processing often occurs in a pipelined fashion. That is, not all of the code blocks may be simultaneously available immediately prior to FEC decoding. For instance, the LLRs of the first code block may be available while the second code block is still undergoing QAM demapping. Depending upon various aspects such as resource constraints, the amount of memory that is available, and the delay budget allocations for receiver processing, it may be necessary to begin FEC decoding before reliability metrics for all of the code blocks within a given transport block can be computed.

Figure 6:
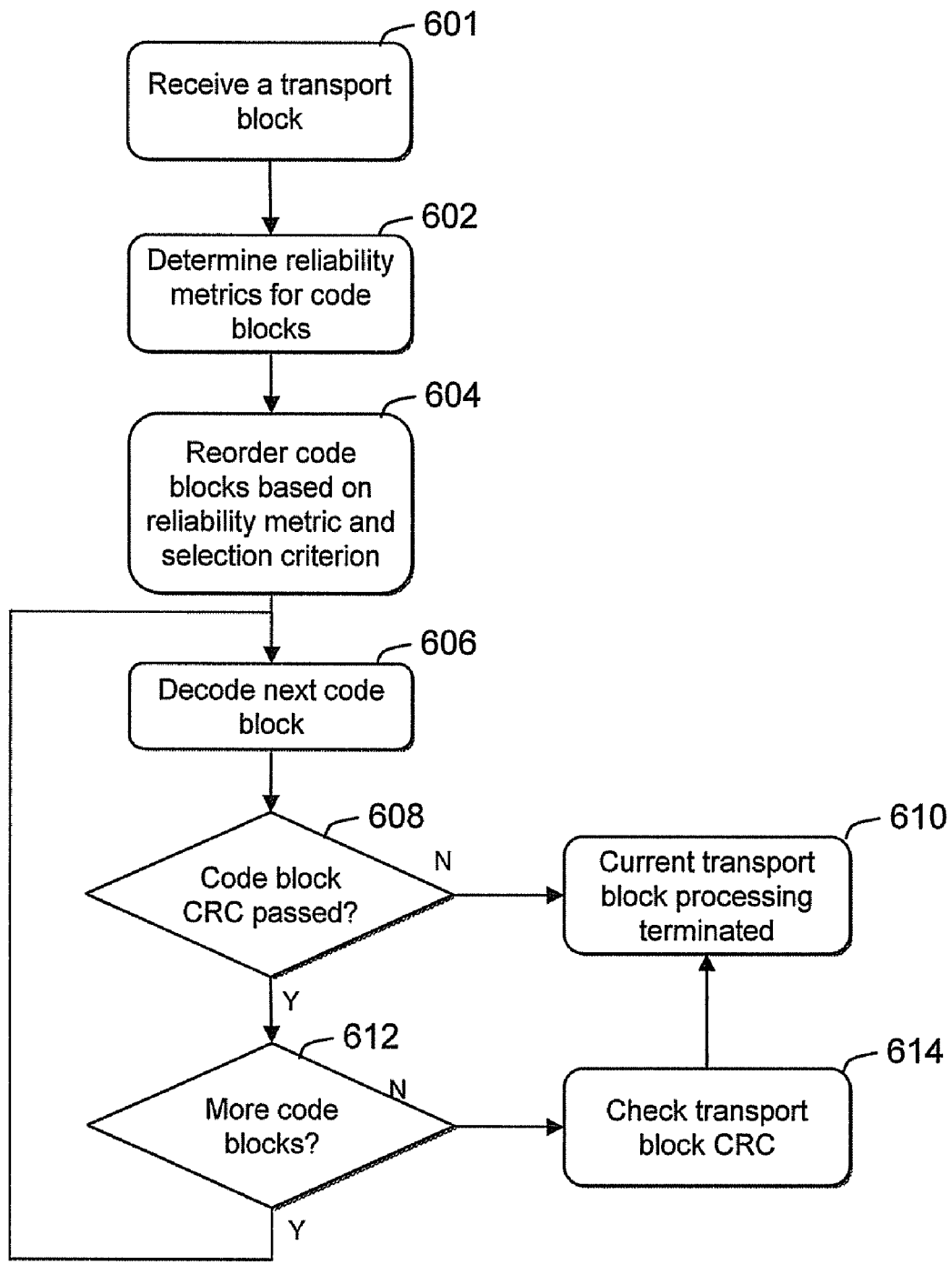
FIG. 6 shows the steps of a decoding process in accordance with one embodiment described in the present patent disclosure.

Referring to FIG. 6, a method in accordance with an embodiment of the present patent disclosure is described, using CRC as an example for error detection and FEC as an example for error correction.

After a transport block is received 601, reliability metrics are calculated for the code blocks of a transport block 602, using information for example, but not limited to, from the QAM demapper, LLR normalizer or HARQ combiner. The code blocks are then reordered 604 based on reliability metrics and selection criteria. The next code block is decoded 606, and if the code block passes the CRC check 608, then the process moves on to the next code block. Processing of the transport block is terminated 610 when a code block fails the CRC test 608 or all code blocks of the transport block are decoded, and the overall transport block CRC is verified 614.

Figure 7:
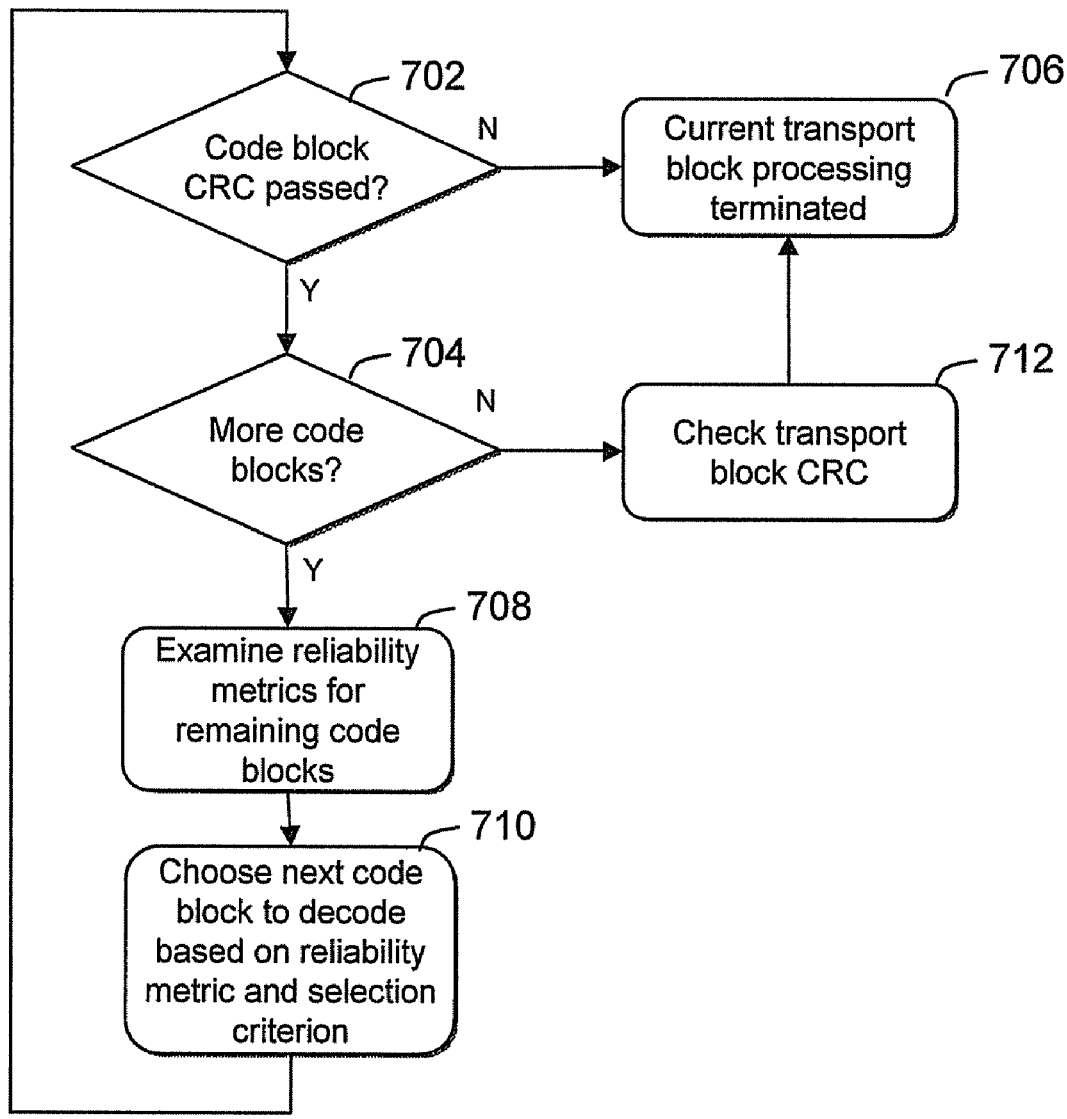
FIG. 7 shows the steps of a decoding process in accordance with another embodiment described in the present patent disclosure.

Referring to FIG. 7, in accordance with another embodiment of the present patent disclosure, a subset of the code blocks within a transport block may be reordered. Similar to the steps described in the above, processing of the transport block is terminated 706 when a code block fails the CRC test 702 or all code blocks of the transport block are decoded 704, and the overall transport block CRC is verified 712. Otherwise, when FEC decoding of a new code block is about to commence, the list of code blocks that are currently available for immediate decoding is examined 708 and the next code block for decoding is chosen based on the current desired selection criterion 710, for example, based on least reliable code block out of those currently available, or based on most reliable code block out of those currently available.

Figure 8:
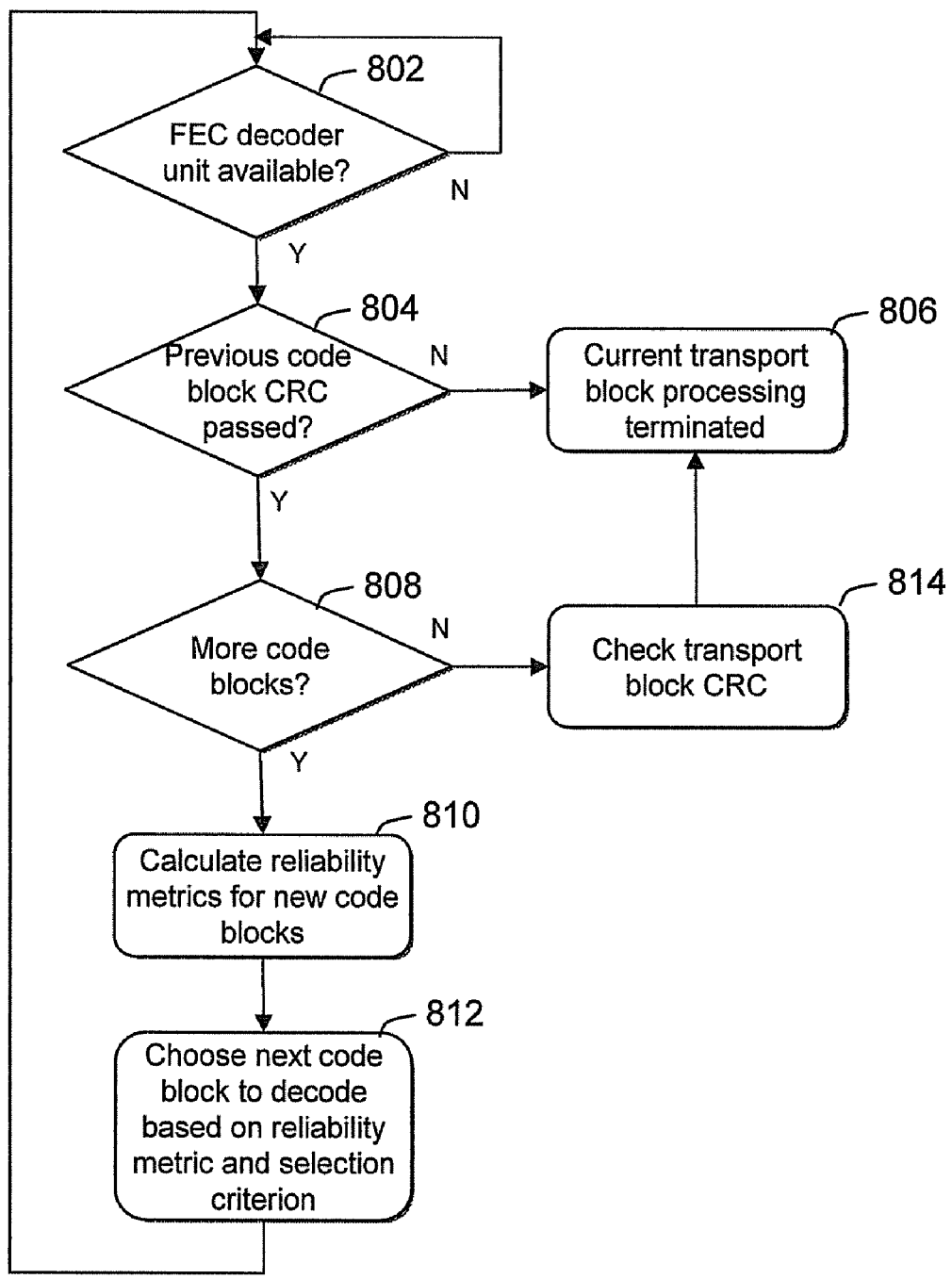
FIG. 8 shows the steps of a decoding process in accordance with another embodiment described in the present patent disclosure.

Referring to FIG. 8, in accordance with another embodiment of the present patent disclosure, a receiver may also include multiple parallel decoding units to process multiple code blocks in parallel. When an FEC decoder unit becomes available 802, the CRC of the code block that was just decoded by that FEC decoder is checked 804. If this CRC fails, then further processing of the transport block would result in waste of power, and execution should therefore terminate 806. If all code blocks have been processed, then the overall transport block CRC is verified 814, and the execution should also terminate 806. If further code blocks remain to be decoded 808, the reliability metrics of any new code blocks are calculated 810. In case of a pipelined processing, code blocks may also be added to the currently pending list. The next code block to be decoded is chosen based on the current selection criterion 812.

Embodiments within the scope of the present invention can be implemented in digital electronic circuitry, or in computer hardware, firmware, software, or in combinations thereof. Apparatus within the scope of the present invention can be implemented in a computer program product tangibly embodied in a machine-readable storage device for execution by a programmable processor; and method actions within the scope of the present invention can be performed by a programmable processor executing a program of instructions to perform functions of the invention by operating on input data and generating output. Embodiments within the scope of the present invention can be implemented advantageously in one or more computer programs that are executable on a programmable system including at least one programmable processor coupled to receive data and instructions from, and to transmit data and instructions to, a data storage system, at least one input device, and at least one output device. Each computer program can be implemented in a high-level procedural or object oriented programming language, or in assembly or machine language if desired; and in any case, the language can be a compiled or interpreted language. Suitable processors include, by way of example, both general and special purpose microprocessors. Generally, a processor will receive instructions and data from a read-only memory and/or a random access memory. Generally, a computer will include one or more mass storage devices for storing data files. Embodiments within the scope of the present invention include computer-readable media for carrying or having computer-executable instructions, computer-readable instructions, or data structures stored thereon. Such computer-readable media may be any available media, which is accessible by a general-purpose or special-purpose computer system. Examples of computer-readable media may include physical storage media such as RAM, ROM, EPROM, CD-ROM or other optical disk storage, magnetic disk storage or other magnetic storage devices, or any other media which can be used to carry or store desired program code means in the form of computer-executable instructions, computer-readable instructions, or data structures and which may be accessed by a general-purpose or special-purpose computer system. Any of the foregoing can be supplemented by, or incorporated in, ASICs (application-specific integrated circuits). While particular embodiments of the present invention have been shown and described, changes and modifications may be made to such embodiments without departing from the true scope of the invention.

What is claimed is:

1. A receiver in a communication system, the receiver comprising:
    a receiving module receiving a transport block, the transport block comprising a plurality of code blocks, each of the plurality of code blocks including an error detection code and an error correction code;
    a first circuit determining a plurality of reliability metrics using an input generated during processing of the code blocks, each of the plurality of reliability metrics corresponding to each of the plurality of code blocks;
    a code block reorderer reordering the plurality of code blocks in an order based on the plurality of reliability metrics and a selection criterion;
    a decoder decoding each of the plurality of code blocks using the error correction code in the order; and
    a verifier verifying each of the plurality of code blocks using the error detection code.

2. The receiver as claimed in claim 1, wherein decoding of remaining code blocks at the decoder is terminated when an error is detected in a decoded code block.

3. The receiver as claimed in claim 1, wherein the error correction code is a forward error correction code.

4. The receiver as claimed in claim 1, wherein the error detection code is selected from the group consisting of parity scheme, checksum, cyclic redundancy check (CRC), hash function, and a combination thereof.

5. The receiver as claimed in claim 1, wherein the error detection code is a cyclic redundancy check (CRC) code.

6. The receiver as claimed in claim 1, wherein the input for generation of the plurality of reliability metrics is from a modulation demapper, a log-likelihood-ratio (LLR) normalizer or a hybrid automatic repeat request (HARQ) combiner.

7. The receiver as claimed in claim 1, wherein the communication system is a wireless transmission system, and the transport block is received in a wireless subframe through a wireless transmission.

8. The receiver as claimed in claim 1, wherein the input for generation of the plurality of reliability metrics is derived from a power control bit of a CDMA protocol, a bit error rate indicator, a frame error rate indicator, a packet error rate indicator, an effective SNR measure based on individual SNRs of a multitude of OFDM subcarriers, a mutual information measure based on individual SNRs of a multitude of OFDM subcarriers, a pilot SNR value in OFDM or a combination thereof.

9. The receiver as claimed in claim 7, wherein the wireless transmission includes an automatic repeat request or a hybrid automatic repeat request mechanism.

10. The receiver as claimed in claim 7, wherein the wireless transmission is selected from the group consisting of Code Division Multiple Access (CDMA), Time Division Multiple Access (TDMA), Frequency Division Multiple Access (FDMA), Orthogonal FDMA (OFDMA), and Single-Carrier FDMA.

11. The receiver as claimed in claim 7, wherein the wireless transmission is selected from the group consisting of a downlink communication, an uplink communication and a combination thereof.

12. The receiver as claimed in claim 1, wherein the error correction code is a block code or a convolutional code.

13. The receiver as claimed in claim 1, wherein the error correction code is selected from a group consisting of Reed-Solomon code, Golay code, Bose-Chaudhuri-Hochquenghem (BCH) code, Hamming code, convolutional code, low-density parity check code and turbo code.

14. The receiver as claimed in claim 1, wherein the code block reorderer reorders a subset of the code blocks.

15. The receiver as claimed in claim 1, further comprising multiple parallel decoding units to process multiple code blocks in parallel.

16. A method of receiving a transport block of data, comprising:
    receiving a transport block, the transport block comprising a plurality of code blocks, each of the plurality of code blocks including an error detection code and an error correction code;
    determining a plurality of reliability metrics using an input generated during processing of the code blocks, each of the plurality of reliability metrics corresponding to each of the plurality of code blocks;
    reordering the plurality of code blocks in an order based on the plurality of reliability metrics and a selection criterion;
    decoding each of the plurality of code blocks using the error correction code in the order; and
    verifying each of the plurality of code blocks using the error detection code.

17. The method as claimed in claim 16, further comprising:
    terminating decoding of remaining code blocks of the transport block when an error is detected in a decoded code block.

18. The method as claimed in claim 16, wherein the error correction code is a forward error correction code.

19. The method as claimed in claim 16, wherein the error detection code is selected from the group consisting of parity scheme, checksum, cyclic redundancy check (CRC), hash function, and a combination thereof.

20. A computer storage medium readable by a computer encoding a computer program for execution by the computer to carry out a method of receiving a transport block of data, the method comprising:
    receiving a transport block, the transport block comprising a plurality of code blocks, each of the plurality of code blocks including an error detection code and an error correction code;

determining a plurality of reliability metrics using an input generated during processing of the code blocks after the transport block is received, each of the plurality of reliability metrics corresponding to each of the plurality of code blocks;

reordering the plurality of code blocks in an order based on the plurality of reliability metrics and a selection criterion;

decoding each of the plurality of code blocks using the error correction code in the order; and verifying each of the plurality of code blocks using the error detection code.

\* \* \* \* \*